United States Patent
Li et al.

(10) Patent No.: US 10,488,714 B2
(45) Date of Patent: Nov. 26, 2019

(54) ARRAY SUBSTRATE AND DISPLAY DEVICE

(71) Applicant: BOE TECHNOLOGY GROUP CO., LTD., Beijing (CN)

(72) Inventors: Pan Li, Beijing (CN); Wenbo Li, Beijing (CN); Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/745,072

(22) PCT Filed: Jul. 27, 2017

(86) PCT No.: PCT/CN2017/094684
§ 371 (c)(1),
(2) Date: Jan. 15, 2018

(87) PCT Pub. No.: WO2018/049927
PCT Pub. Date: Mar. 22, 2018

(65) Prior Publication Data
US 2019/0011785 A1    Jan. 10, 2019

(30) Foreign Application Priority Data
Sep. 18, 2016    (CN) .................. 2016 2 1060816 U (51) Int. Cl.
*G02F 1/1343* (2006.01)
*H01L 27/12* (2006.01)
(Continued)

(52) U.S. Cl.
CPC .. *G02F 1/134309* (2013.01); *G02F 1/133514* (2013.01); *G02F 1/136213* (2013.01);
(Continued)

(58) Field of Classification Search
CPC ................................................................
H01L 51/0072; H01L 33/62; H01L 51/5056; H01L 51/5072; C09K 11/06
(Continued)

(56) References Cited

U.S. PATENT DOCUMENTS 9,835,922 B2 * 12/2017 Cheng .................. G02F 1/1368
2002/0085156 A1 * 7/2002 Lee .................. G02F 1/133512
349/141
(Continued)

FOREIGN PATENT DOCUMENTS

CN    101315507 A    12/2008
CN    101501561 A    8/2009
(Continued)

OTHER PUBLICATIONS

International Search Report and Written Opinion dated Oct. 27, 2017, for corresponding PCT Application No. PCT/CN2017/094684.

*Primary Examiner* — Andy Huynh
(74) *Attorney, Agent, or Firm* — Kinney & Lange, P.A.

(57) ABSTRACT

The present disclosure discloses an array substrate and a display device. A pixel electrode of the array substrate includes a first subpixel electrode and a second subpixel electrode, and a storage capacitor includes a first storage capacitor and a second storage capacitor, wherein the first storage capacitor is configured to maintain a voltage difference between the first subpixel electrode and the common electrode line, the second storage capacitor is configured to maintain a voltage difference between the second subpixel electrode and the common electrode line, and the first storage capacitor and the second storage capacitor have different capacitances.

19 Claims, 3 Drawing Sheets

(51) Int. Cl.
  *G02F 1/1335* (2006.01)
  *G02F 1/1362* (2006.01)
  *G02F 1/1368* (2006.01)

(52) U.S. Cl.
  CPC ............ *H01L 27/12* (2013.01); *H01L 27/124* (2013.01); *H01L 27/1255* (2013.01); *G02F 1/1368* (2013.01); *G02F 1/136286* (2013.01); *G02F 2001/134345* (2013.01)

(58) Field of Classification Search
  USPC .......................................................... 257/71
  See application file for complete search history.

(56) References Cited

U.S. PATENT DOCUMENTS

| | | |
|---|---|---|
| 2007/0132899 A1 | 6/2007 | Cheng et al. |
| 2010/0182345 A1 | 7/2010 | Shimoshikiryoh et al. |
| 2016/0291367 A1 | 10/2016 | Cheng et al. |
| 2017/0207251 A1* | 7/2017 | Liu .................... H01L 27/1222 |

FOREIGN PATENT DOCUMENTS

| | | |
|---|---|---|
| CN | 204065625 U | 12/2014 |
| CN | 1049926 A | 10/2015 |
| CN | 206002819 U | 3/2017 |

* cited by examiner

ARRAY SUBSTRATE AND DISPLAY DEVICE

CROSS-REFERENCE TO RELATED APPLICATION

This application is the U.S. national phase of PCT application No. PCT/CN2017/094684 filed on Jul. 27, 2017, which claims a priority of the Chinese Patent Application No. 201621060816.4 filed on Sep. 18, 2016, the disclosures of which are incorporated in their entirety by reference herein.

TECHNICAL FIELD

The present disclosure relates to a field of display technology, in particular to an array substrate and a display device.

BACKGROUND

Liquid crystal display technologies are widely used in TV, a mobile phone, public information display, or the like. The liquid crystal display mainly includes a twist nematic (TN) mode, a vertical-aligned (VA) mode, and an in-plane switching (IPS) mode. A vertical-aligned liquid crystal display has a high contrast, and may realize an 8-domain liquid crystal alignment in one pixel, thereby obtaining a wide viewing angle. Therefore, the vertical-aligned mode has wide application in a large-screen liquid crystal television. Currently, the 8-domain liquid crystal alignment is usually realized in a charge sharing manner. As for one pixel, two adjacent gate lines are required to implement the charge sharing manner. Consequently, the array substrate has a relatively complicated wiring structure, and an aperture ratio of the pixel is decreased.

SUMMARY

The present disclosure provides an array substrate and a display device, for providing a simple structure capable of realizing multi-domain display.

At least one embodiment of the present disclosure provides an array substrate, including a pixel region where a pixel electrode, a storage capacitor and a semiconductor device are arranged, wherein the pixel electrode includes a first subpixel electrode and a second subpixel electrode, the semiconductor device includes a first thin film transistor and a second thin film transistor, the first subpixel electrode is insulated from the second subpixel electrode, the first subpixel electrode is electrically connected with a drain electrode of the first thin film transistor, the second subpixel electrode is electrically connected with a drain electrode of the second thin film transistor, the storage capacitor includes a first storage capacitor and a second storage capacitor, a capacitance of the first storage capacitor is greater than that of the second storage capacitor, the first storage capacitor is configured to maintain a voltage applied to the first subpixel electrode, and the second storage capacitor is configured to maintain a voltage applied to the second subpixel electrode.

Optionally, a gate electrode of the first thin film transistor is formed integrally with a gate electrode of the second thin film transistor, a source electrode of the first thin film transistor is formed integrally with a source electrode of the second thin film transistor, and an active layer of the first thin film transistor is formed integrally with an active layer of the second thin film transistor.

Optionally, the array substrate further includes a common electrode line, wherein an orthogonal projection of the drain electrode of the first thin film transistor onto a plane where the array substrate is arranged overlaps an orthogonal projection of the common electrode line onto the plane where the array substrate is arranged, to form a first overlapping region, and a part of the drain electrode of the first thin film transistor located in the first overlapping region and a part of the common electrode line located in the first overlapping region form the first storage capacitor.

Optionally, an orthogonal projection of the drain electrode of the second thin film transistor onto the plane where the array substrate is arranged overlaps the orthogonal projection of the common electrode line onto the plane where the array substrate is arranged, to form a second overlapping region, and a part of the drain electrode of the second thin film transistor located in the second overlapping region and a part of the common electrode line located in the second overlapping region form the second storage capacitor.

Optionally, an area of the second overlapping region is less than that of the first overlapping region. Further, a ratio of the area of the first overlapping region to the area of the second overlapping region is d, where $2 \leq d \leq 10$.

Optionally, the capacitance of the second storage capacitor is zero.

Optionally, an orthogonal projection of the drain electrode of the second thin film transistor onto the plane where the array substrate is arranged does not overlap the orthogonal projection of the common electrode line onto the plane where the array substrate is arranged.

Optionally, the array substrate further includes a common electrode line, wherein an orthogonal projection of the drain electrode of the first thin film transistor onto a plane where the array substrate is arranged overlaps an orthogonal projection of the common electrode line onto the plane where the array substrate is arranged, to form a first overlapping region, and a part of the drain electrode of the first thin film transistor located in the first overlapping region and a part of the common electrode line located in the first overlapping region form a third storage capacitor; an orthogonal projection of the first subpixel electrode onto the plane where the array substrate is arranged overlaps the orthogonal projection of the common electrode line onto the plane where the array substrate is arranged, to form a third overlapping region, a part of the first subpixel electrode located in the third overlapping region and the part of the common electrode line located in the third overlapping region form a fourth storage capacitor, and the first storage capacitor is formed by the third storage capacitor and the fourth storage capacitor that are connected in parallel.

Optionally, an orthogonal projection of the drain electrode of the second thin film transistor onto the plane where the array substrate is arranged overlaps the orthogonal projection of the common electrode line onto the plane where the array substrate is arranged, to form a second overlapping region; and a part of the drain electrode of the second thin film transistor located in the second overlapping region and the part of the common electrode line located in the second overlapping region form the second storage capacitor, and an area of the second overlapping region is less than that of the first overlapping region.

Optionally, the array substrate further includes a branch line formed integrally with the common electrode line, wherein an extension direction of the branch line is different from that of the common electrode line, and an orthogonal projection of the branch line onto the plane where the array substrate is arranged overlaps the orthogonal projection of the first subpixel electrode onto the plane where the array substrate is arranged, to form a third overlapping region.

Optionally, the orthogonal projection of the branch line onto the plane where the array substrate is arranged overlaps an orthogonal projection of the second subpixel electrode onto the plane where the array substrate is arranged, to form a fourth overlapping region.

Optionally, the first subpixel electrode includes a first slit electrode with a plurality of first slits extending in at least two directions.

Optionally, the first subpixel electrode further includes a first platelike electrode block that is formed integrally with the first slit electrode.

Optionally, the second subpixel electrode includes a second slit electrode with a plurality of second slits extending in at least two directions.

Optionally, the second subpixel electrode further includes a second platelike electrode block that is formed integrally with, and arranged at a layer identical to, the second slit electrode.

Optionally, the plurality of first slits includes a first subslit extending in a first direction and a second subslit extending in a second direction; the plurality of second slits includes a third subslit extending in a third direction and a fourth subslit extending in a fourth direction; and the first direction, the second direction, the third direction and the fourth direction are different from each other.

Optionally, an area of the first subpixel electrode is different from that of the second subpixel electrode.

The at least one embodiment of the present disclosure further provides a display device, including any one of the above-mentioned array substrates.

Optionally, the display device further includes a color filter substrate, including a common electrode with a plurality of third slits extending in at least two directions, wherein the pixel electrode comprises a platelike electrode block, and a region where the plurality of third slits is located corresponds to a region where the platelike electrode block is located.

BRIEF DESCRIPTION OF THE DRAWINGS

In order to more clearly explain the technical solutions of the embodiments of the present disclosure or a related art, the drawings to be used in the descriptions of the embodiments or the related art are briefly introduced as follows. Apparently, the following drawings merely illustrate some embodiments of the present disclosure, and a person skilled in the art can obtain other drawings from these drawings without any creative effort.

DETAILED DESCRIPTION

The present disclosure will be further described below in detail in combination with drawings and embodiments. The following embodiments are used to explain the present disclosure, but not to limit the scope of the present disclosure.

An embodiment provides an array substrate capable of simply realizing the multi-domain display.

Figure 1:
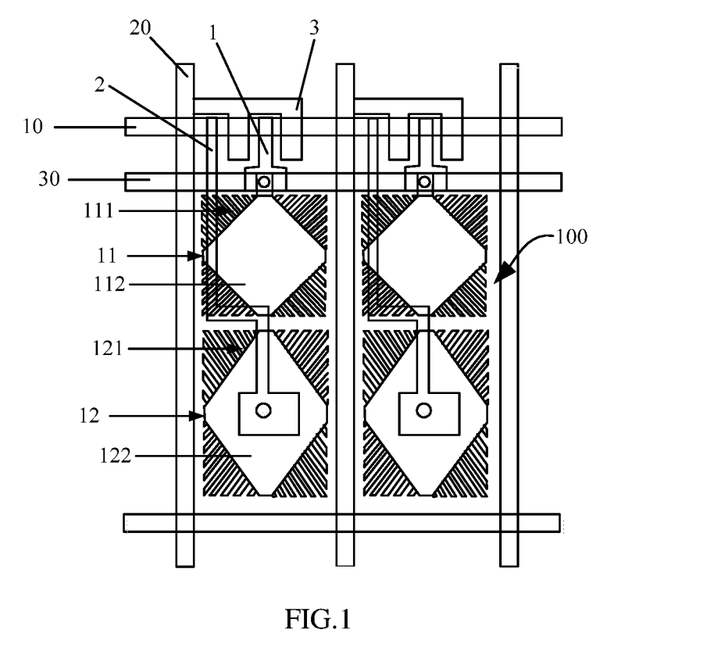
FIG. 1 shows a structural schematic diagram of an array substrate according to some embodiments of the present disclosure.

As shown in FIG. 1, the array substrate includes a plurality of pixel regions 100. To be specific, the array substrate further includes a plurality of gate lines 10 and a plurality of data lines 20, which define the plurality of pixel regions 100. For example, a region between two adjacent parallel gate lines and two adjacent parallel data lines is defined as one pixel region, wherein the gate lines are substantially perpendicular to the data lines.

Each pixel region 100 includes a pixel electrode, a storage capacitor and a semiconductor device. The storage capacitor is configured to maintain a voltage applied to the pixel electrode. The semiconductor device includes a first thin film transistor and a second thin film transistor. For the sake of convenience of description, a drain electrode of the first thin film transistor is referred to as a first drain electrode 1, and a drain electrode of the second thin film transistor is referred to as a second drain electrode 2.

The pixel electrode includes a first subpixel electrode 11 and a second subpixel electrode 12 that are insulated from each other. The first subpixel electrode 11 is electrically connected with the first drain electrode 1, and the second subpixel electrode 12 is electrically connected with the second drain electrode 2. The storage capacitor includes a first storage capacitor and a second storage capacitor. A capacitance of the first storage capacitor is different from that of the second storage capacitor. For example, the capacitance of the first storage capacitor is greater than that of the second storage capacitor. The first storage capacitor is configured to maintain the voltage applied to first subpixel electrode 11, and the second storage capacitor is configured to maintain the voltage applied to second subpixel electrode 12.

In the above-mentioned array substrate, since the capacitance of the first storage capacitor is greater than the capacitance of the second storage capacitor, a discharging speed of the first subpixel electrode 11 through the first storage capacitor is less than that of the second subpixel electrode 12 through the second storage capacitor, such that a voltage difference exists between the first subpixel electrode 11 and the second subpixel electrode 12, thereby realizing the multi-domain display and enlarging the viewing angle. Moreover, the structure is simple for implementing the multi-domain display, and the aperture ratio of the pixel would not be affected adversely.

Specifically, both the first storage capacitor and the second storage capacitor have capacitances greater than zero, and the capacitance of the first storage capacitor is greater than that of the second storage capacitor; or the capacitance of the first storage capacitor is greater than zero, and the capacitance of the second storage capacitance is zero.

An area of the first subpixel electrode 11 may be the same as, or different from, that of the second subpixel electrode 12.

Optionally, a gate electrode (not shown in the drawings) of the first thin film transistor is formed integrally with a gate electrode of the second thin film transistor, and is electrically connected with a gate line 10. By transmitting a gate scan signal to the gate line 10, the first thin film transistors and the second thin film transistors can be turned on row by row. Further, a source electrode 3 of the first thin film transistor is formed integrally with a source electrode of the second thin film transistor, and is connected with the data line 20. By transmitting a data signal to the first subpixel electrode 11 and the second subpixel electrode 12 through a data line 20, deflection of corresponding liquid crystal molecules is controlled to implement display. Of course, an active layer (not shown in the drawings) of the first thin film transistor may also be integrated with an active layer of the second thin film transistor. In the technical solution of the present disclosure, the multi-domain display is implemented by setting different capacitances of the storage capacitors corresponding to the first subpixel electrode 11 and the second subpixel electrode 12. The integrated structures of the gate electrodes, source electrodes and active layers of the first thin film transistor and the second thin film transistor can not only simplify the manufacturing process and reduces costs, but also implements the multi-domain display. In addition, switches of the first thin film transistor and the second thin film transistor may be controlled by a same gate line, and the data signal is transmitted to the first thin film transistor and the second thin film transistor by the same data line.

It should be noted that the first thin film transistor and the second thin film transistor may also be controlled by different gate lines and/or different data lines, which falls within the protection scope of the present disclosure.

The array substrate further includes a common electrode line 30, configured to provide a reference voltage. The first storage capacitor may be formed by the first drain electrode 1 and the common electrode line 30, or by the first drain electrode 1 and the gate line 10, or by a storage capacitor formed by the first drain electrode 1 and the common electrode line 30 and a storage capacitor formed by the first drain electrode 1 and the gate line 10. The second storage capacitor may be formed by the second drain electrode 2 and the common electrode line 30, or by the second drain electrode 2 and the gate line 10, or by a storage capacitor formed by the second drain electrode 2 and the common electrode line 30 and a storage capacitor formed by the second drain electrode 2 and the gate line 10. Since the drain electrode, the common electrode line and the gate line are made of metal materials, enabling to provide a relatively large storage capacitance. Of course, a storage capacitor may also be formed between the pixel electrode and the common electrode line, as long as the capacitance of the first storage capacitor is different from that of the second storage capacitor.

In a specific embodiment, as shown in FIG. 1, the storage capacitor configured to maintain a pixel voltage is formed by the drain electrode and the common electrode line. Specifically, an orthogonal projection of the first drain electrode 1 of the first thin film transistor onto a plane where the array substrate is arranged overlaps an orthogonal projection of the common electrode line 30 onto the plane where the array substrate is arranged, to form a first overlapping region. A part of the first drain electrode 1 located in the first overlapping region and a part of the common electrode line 30 located in the first overlapping region form the first storage capacitor. By setting a width of the part of the first drain electrode 1 located in the first overlapping region greater than a width of other part(s) of the first drain electrode 1, an area of the first overlapping region may be enlarged, thereby increasing the capacitance of the first storage capacitor. The area of the first overlapping region is an area of the first drain electrode 1 facing the common electrode line 30.

An orthogonal projection of the second drain electrode 2 of the second thin film transistor onto the plane where the array substrate is arranged overlaps an orthogonal projection of the common electrode line 30 onto the plane where the array substrate is arranged, to form a second overlapping region. A part of the second drain electrode 2 located in the second overlapping region and a part of the common electrode line 30 located in the second overlapping region form the second storage capacitor. The area of the second overlapping region means an area of the second drain electrode 2 facing the common electrode line 30.

The area of the second overlapping region is less than that of the first overlapping region, so that the capacitance of the second storage capacitor is less than that of the first storage capacitor. Optionally, the ratio of the area of the first overlapping region to that of the second overlapping region is d, where $2 \leq d \leq 10$, so that the discharging speed of the first subpixel electrode 11 is much less than the discharging speed of the second subpixel electrode 12, the voltage difference between the first subpixel electrode 11 and the second subpixel electrode 12 is increased, and the display viewing angle is effectively increased.

Figure 2:
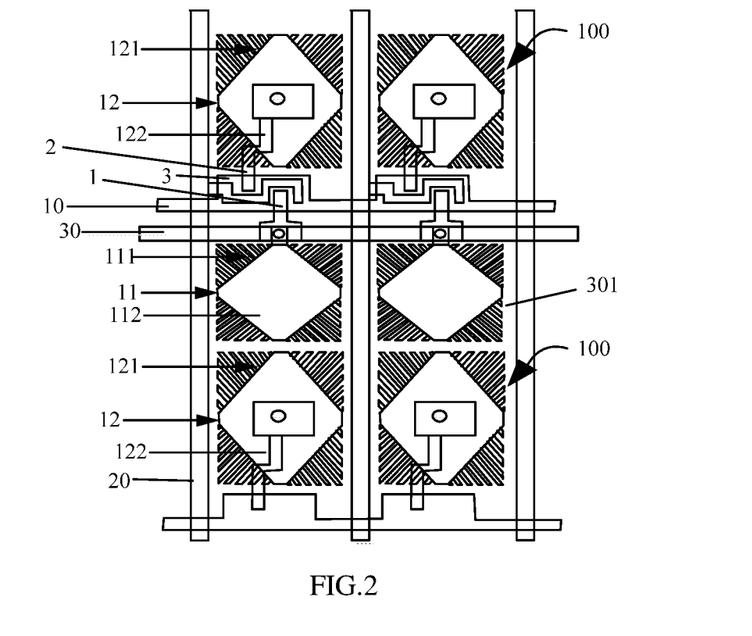
FIG. 2 shows a structural schematic diagram of an array substrate according to some embodiments of the present disclosure.

In another specific embodiment, as shown in FIG. 2, the storage capacitor configured to maintain the pixel voltage is also formed by the drain electrode and the common electrode line. Different from the above-mentioned embodiment, an orthogonal projection of the second drain electrode 2 of the second thin film transistor onto the plane where the array substrate is arranged does not overlap an orthogonal projection of the common electrode line 30 onto the plane where the array substrate is arranged, and the capacitance of the second storage capacitor is zero. The capacitance of the first storage capacitor is greater than zero, and is greater than the capacitance of the second storage capacitor, which may also realize the purpose of the present disclosure. A person skilled in the art easily obtains that with respect to one of the above-mentioned embodiments, the width of the first drain electrode located in the first overlapping region may not be increased.

In the above-mentioned embodiments, the storage capacitor configured to maintain the pixel voltage is only formed by the drain electrode and the common electrode line, and the capacitance of the first storage capacitor is greater than that of the second storage capacitance by controlling the area of the drain electrode facing the common electrode line.

Figure 3:
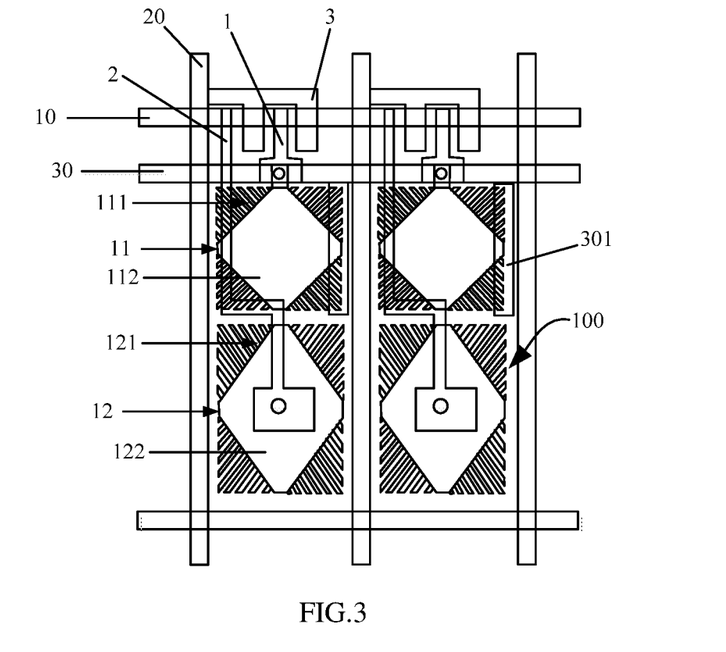
FIG. 3 shows a structural schematic diagram of an array substrate according to some embodiments of the present disclosure.

During the practical application, as a specific embodiment, as shown in FIG. 3, an orthogonal projection of the first drain electrode 1 of the first thin film transistor onto the plane where the array substrate is arranged overlaps an orthogonal projection of the common electrode line 30 onto the plane where the array substrate is arranged, to form a first overlapping region, and a part of the first drain electrode 1 located in the first overlapping region and a part of the common electrode line 30 located in the first overlapping region form a third storage capacitor. An orthogonal projection of the first subpixel electrode 11 onto the plane where the array substrate is arranged overlaps an orthogonal projection of the common electrode line 30 onto the plane where the array substrate is arranged, to form a third overlapping region, and a part of the first subpixel electrode 11 located in the third overlapping region and the part of the common electrode line 30 located in the third overlapping region form a fourth storage capacitor. The first storage capacitor configured to maintain the voltage applied to first subpixel electrode 11 is formed by connecting the third storage capacitor and the fourth storage capacitor in parallel.

An orthogonal projection of the second drain electrode 2 of the second thin film transistor onto the plane where the array substrate is arranged overlaps an orthogonal projection of the common electrode line 30 onto the plane where the array substrate is arranged to form a second overlapping region, and a part of the second drain electrode 2 located in the second overlapping region and the part of the common electrode line 30 located in the second overlapping region form the second storage capacitor.

The area of the second overlapping region may be less than that of the first overlapping region, so that the capacitance of the second storage capacitor is less than that of the third storage capacitor. The first storage capacitor is formed by connecting the third storage capacitor and the fourth storage capacitor in parallel, and hence the capacitance of the first storage capacitor may be greater than that of the second storage capacitance, which fulfills the purpose of the present disclosure.

Specifically, a branch line 301 may be arranged integrally with the common electrode line 30, an extension direction of the branch line 301 is different from that of the common electrode line 30. An orthogonal projection of the branch line 301 onto the plane where the array substrate is arranged overlaps an orthogonal projection of the first subpixel electrode 11 onto the plane where the array substrate is arranged, to form a third overlapping region.

Figure 4:
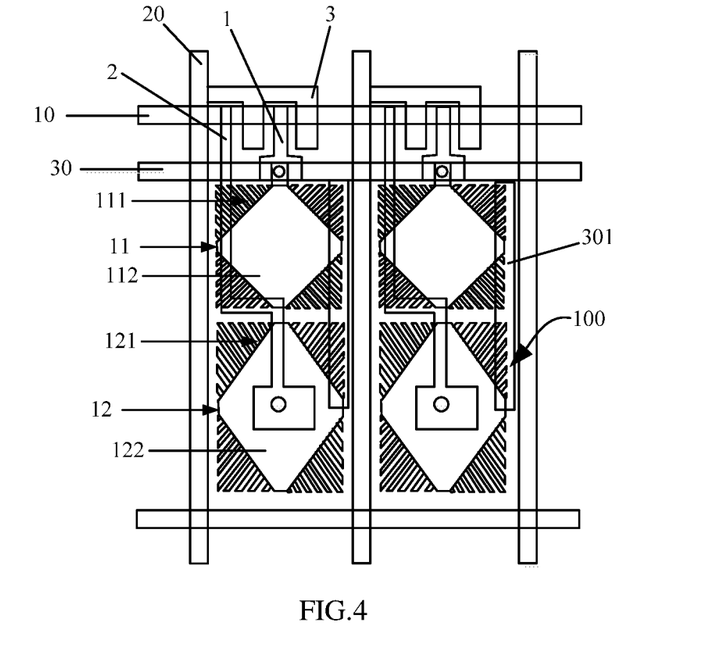
FIG. 4 shows a structural schematic diagram of an array substrate according to some embodiments of the present disclosure.

Based on the above-mentioned specific embodiment, as shown in FIG. 4, the orthogonal projection of the branch line 301 onto the plane where the array substrate is arranged overlaps an orthogonal projection of the second subpixel electrode 12 onto the plane where the array substrate is arranged, to form a fourth overlapping region, which may also make the capacitance of the storage capacitor configured to maintain the voltage of the first subpixel electrode 11 greater than the capacitance of the storage capacitor configured to maintain the voltage of the second subpixel electrode 12. For example, the area of the fourth overlapping region may be set to be half of the area of the third overlapping region. The third overlapping region is the one where the first subpixel electrode 11 facing the common electrode line 30.

It should be noted that the above description merely relates to several implementations of making the capacitance of the first storage capacitor greater than that of the second storage capacitor. Persons skilled in the art easily know that the implementation of realizing the capacitance of the first storage capacitor greater than that of the second storage capacitor is not limited thereto. For example, an orthogonal projection of the first drain electrode onto the plane where the array substrate is arranged overlaps an orthogonal projection of the gate line onto the plane where the array substrate is arranged, so as to increase the capacitance of the first storage capacitor, to name but a few, which also falls within the protection scope of the present disclosure.

In order to further increase a display viewing angle, the first subpixel electrode 11 according to the present embodiment includes a first slit electrode with first slits 111 extending in at least two directions, which provides a multi-domain electric field, and increases the display viewing angle. The first subpixel electrode 11 further includes a first platelike electrode block 112. Correspondingly, the common electrode have third slits extending in at least two directions, and a region where the third slits are located correspond to a region where the first electrode block 112 is located, which may also provide the multi-domain electric field, and further increase the display viewing angle. Optionally, the first electrode block 112 is formed integrally with the first slit electrode, and the integrated structure may be formed by a same patterning process within a same layer, which simplifies the manufacturing process.

Based on the same theory, the second subpixel electrode 12 according to the present embodiment includes a second slit electrode with the second slits 121 extending in at least two directions, which provides a multi-domain electric field, and increases the display viewing angle. The second subpixel electrode 12 further includes a second platelike electrode block 122. Correspondingly, the common electrode have the third slits extending in at least two directions on the common electrode, and a region where the third slits are located correspond to a region where the second electrode block 122 is located, which may also provide the multi-domain electric field, and further increase the display viewing angle. Optionally, the second electrode block 122 is formed integrally with the second slit electrode, and the integrated structure may be formed by a same patterning process within a same layer, which simplifies the manufacturing process.

In practical applications, for a same pixel region, the display viewing angle may be increased by forming the slits extending in at least two directions on the first subpixel electrode 11 and/or the second subpixel electrode 12. Of course, for the same pixel region, the slits extending in at least two different directions may also be formed on the common electrode, so as to increase the display viewing angle. The Person skilled in the art easily obtains that, as for the same pixel region, the slits may be formed on the pixel electrode and the common electrode simultaneously, so as to increase the display viewing angle.

Further, as shown in FIG. 1, the first slits 111 on the first subpixel electrode 11 and the second slits 121 on the second subpixel electrode 12 extend in completely different directions. In the present embodiment, the first slits 111 include a first subslit extending in a first direction and a second subslit extending in a second direction. The second slits 121 include a third subslit extending in a third direction and a fourth subslit extending in a fourth direction. The first direction, second direction, third direction and fourth directions are different from each other, such that the first slits 111 and the second slits 121 extend in completely different directions, which may provide electric fields from different directions, and further increase the viewing angle.

Further, the first slits 111 on the first subpixel electrode 11 and the second slits 121 on the second subpixel electrode 12 may extend in the same direction, to simplify the manufacturing process.

As shown in FIG. 1, the array substrate according to the present embodiment includes: a plurality of gate lines 10 and a plurality of data lines 20, to define a plurality of pixel regions 100.

Each pixel region 100 includes: a first thin film transistor and a second thin film transistor, wherein the gate electrode of the first thin film transistor and the gate electrode of the second thin film transistor are formed integrally with the gate line 10, the source electrode 3 of the first thin film transistor and the source electrode of the second thin film transistor are formed integrally with the data lines 20, the active layer of the first thin film transistor is formed integrally with the active layer of the second thin film transistor, and the source electrode 3 of the first thin film transistor and the source electrode of the second thin film transistor form a double U-shaped structure; a pixel electrode, including a first subpixel electrode 11 and a second subpixel electrode 12 that are made of a same transparent conductive layer, and are spaced apart to realize insulation, wherein the first subpixel electrode 11 is electrically contacted with the first drain electrode 1 of the first thin film transistor by a via hole in an insulating layer located therebetween, and the second subpixel electrode 12 is electrically contacted with the second drain electrode 2 of the second thin film transistor through the via hole in the insulating layer located therebetween; the first subpixel electrode 11 including a first slit electrode with first slits 111 extending in two directions and a first platelike electrode block 112 that is formed integrally with the first slit electrode; and the second subpixel electrode 12 including a second slit electrode with second slits 121 extending in two directions and a second platelike electrode block 122 that is formed integrally with the second slit electrode.

The first slits 111 include a first subslit extending in a first direction and a second subslit extending in a second direction. The second slits 121 include a third subslit extending in a third direction and a fourth subslit extending in a fourth direction. The first direction, the second direction, the third direction and the fourth direction are different from each other.

The pixel electrode of the above-mentioned array substrate includes a first subpixel electrode and a second subpixel electrode. Due to different discharging speeds of the first subpixel electrode and the second subpixel electrode, there exits the voltage difference, thereby realizing the multi-domain display by a simple structure, without adverse influence on the aperture ratio of the pixel. Moreover, there is no need to change the driving of the display device, and only the structural change makes control simple. The slits extending in at least two directions are formed on the first subpixel electrode and the second subpixel electrode, to further increase the display viewing angle. The adoption of the above-mentioned array substrate may realize the 8-domain display.

Figure 5:
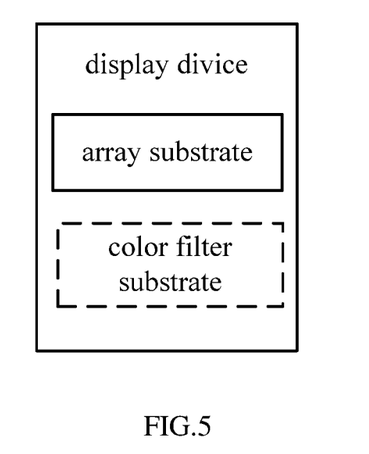
FIG. 5 shows a schematic block diagram of a display device according to some embodiments of the present disclosure.

The present embodiment further provides a display device adopting any one of the above-mentioned array substrates, as shown in FIG. 5 schematically, so as to realize the multi-domain display and increase the display viewing angle. Moreover, the simple structure is convenient to implement and the aperture ratio of the pixel unit is not affected adversely.

The display device further includes a color filter substrate, including a plurality of pixel regions, each of which includes a color filter layer capable of realizing color display. In the practical structure, the array substrate may be arranged opposite to the color filter substrate.

Figure 6:
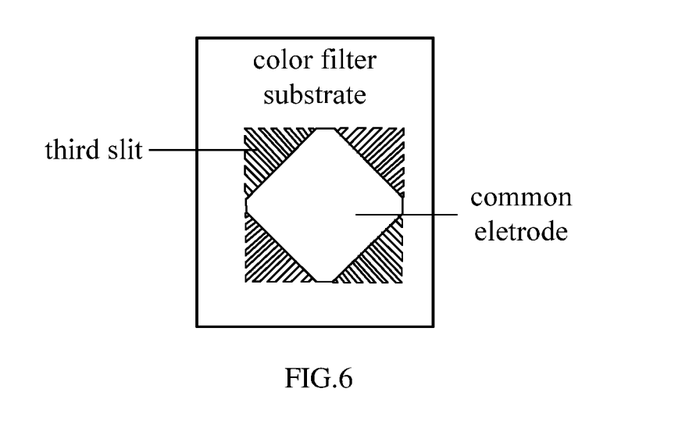
FIG. 6 shows a schematic block diagram of a color filter substrate according to some embodiments of the present disclosure.

Optionally, the color filter substrate further includes a common electrode, including third slits extending in at least two directions. A single common electrode is shown in FIG. 6 schematically.

The pixel electrode on the array substrate includes a platelike electrode block, and a region where the plurality of third slits is located corresponds to a region where the platelike electrode block is located, to provide the multi-domain electric field and further increase the display viewing angle.

The above descriptions are merely optional embodiments of the present disclosure, and it should be noted that several improvements and substitutions may be made for a person skilled in the art without departing from the principle of the present disclosure, and also should be considered to fall within the protection scope of the present disclosure.

What is claimed is:

1. An array substrate, comprising a pixel region where a pixel electrode, a storage capacitor and a semiconductor device are arranged, wherein
the pixel electrode comprises a first subpixel electrode and a second subpixel electrode,
the semiconductor device comprises a first thin film transistor and a second thin film transistor,
the first subpixel electrode is insulated from the second subpixel electrode,
the first subpixel electrode is electrically connected with a drain electrode of the first thin film transistor,
the second subpixel electrode is electrically connected with a drain electrode of the second thin film transistor,
the storage capacitor comprises a first storage capacitor and a second storage capacitor,
a capacitance of the first storage capacitor is greater than that of the second storage capacitor,
the first storage capacitor is configured to maintain a voltage applied to the first subpixel electrode, and
the second storage capacitor is configured to maintain a voltage applied to the second subpixel electrode,
wherein the array substrate further comprises:
a common electrode line,
wherein an orthogonal projection of the drain electrode of the first thin film transistor onto a plane where the array substrate is arranged overlaps an orthogonal projection of the common electrode line onto the plane where the array substrate is arranged, to form a first overlapping region, and a part of the drain electrode of the first thin film transistor located in the first overlapping region and a part of the common electrode line located in the first overlapping region form the first storage capacitor,
wherein the source electrode of the first thin film transistor and the source electrode of the second thin film transistor form a double U-shaped structure, and the source electrode of the first thin film transistor the source electrode of the second thin film transistor are in a direct touch to form a shape of , and
wherein a width of the part of the drain electrode of the first thin film transistor located in the first overlapping region is greater than widths of parts of the drain electrode of the first thin film transistor outside the first overlapping region.

2. The array substrate according to claim 1, wherein
a gate electrode of the first thin film transistor is formed integrally with a gate electrode of the second thin film transistor,
a source electrode of the first thin film transistor is formed integrally with a source electrode of the second thin film transistor, and
an active layer of the first thin film transistor is formed integrally with an active layer of the second thin film transistor.

3. The array substrate according to claim 1, wherein an orthogonal projection of the drain electrode of the second thin film transistor onto the plane where the array substrate is arranged overlaps the orthogonal projection of the common electrode line onto the plane where the array substrate is arranged, to form a second overlapping region, and a part of the drain electrode of the second thin film transistor located in the second overlapping region and a part of the common electrode line located in the second overlapping region form the second storage capacitor.

4. The array substrate according to claim 3, wherein an area of the second overlapping region is less than that of the first overlapping region.

5. The array substrate according to claim 4, wherein a ratio of the area of the first overlapping region to the area of the second overlapping region is d, where $2 \leq d \leq 10$.

6. The array substrate according to claim 1, wherein the capacitance of the second storage capacitor is zero.

7. The array substrate according to claim 6, wherein an orthogonal projection of the drain electrode of the second thin film transistor onto the plane where the array substrate is arranged does not overlap the orthogonal projection of the common electrode line onto the plane where the array substrate is arranged.

8. The array substrate according to claim 1,
wherein an orthogonal projection of the first subpixel electrode onto the plane where the array substrate is arranged to overlap the orthogonal projection of the common electrode line onto the plane where the array substrate is arranged, to form a third overlapping region, a part of the first subpixel electrode located in the third overlapping region and the part of the common electrode line located in the third overlapping region form a third storage capacitor, and the first storage capacitor and the third storage capacitor are connected in parallel to form a fourth storage capacitor.

9. The array substrate according to claim 8, wherein:
an orthogonal projection of the drain electrode of the second thin film transistor onto the plane where the array substrate is arranged overlaps the orthogonal projection of the common electrode line onto the plane where the array substrate is arranged, to form a second overlapping region; and
a part of the drain electrode of the second thin film transistor located in the second overlapping region and the part of the common electrode line located in the second overlapping region form the second storage capacitor, and an area of the second overlapping region is less than that of the first overlapping region.

10. The array substrate according to claim 8, further comprising a branch line formed integrally with the common electrode line, wherein an extension direction of the branch line is different from that of the common electrode line, and an orthogonal projection of the branch line onto the plane where the array substrate is arranged overlaps the orthogonal projection of the first subpixel electrode onto the plane where the array substrate is arranged, to form a third overlapping region.

11. The array substrate according to claim 10, wherein the orthogonal projection of the branch line onto the plane where the array substrate is arranged overlaps an orthogonal projection of the second subpixel electrode onto the plane where the array substrate is arranged, to form a fourth overlapping region.

12. The array substrate according to claim 1, wherein the first subpixel electrode comprises a first slit electrode with a plurality of first slits extending in at least two directions.

13. The array substrate according to claim 12, wherein the first subpixel electrode further comprises a first platelike electrode block that is formed integrally with the first slit electrode.

14. The array substrate according to claim 13, wherein the second subpixel electrode comprises a second slit electrode with a plurality of second slits extending in at least two directions.

15. The array substrate according to claim 14, wherein the second subpixel electrode further comprises a second plate-like electrode block that is formed integrally with, and arranged at a layer identical to, the second slit electrode.

16. The array substrate according to claim 15, wherein:
the plurality of first slits comprises a first subslit extending in a first direction and a second subslit extending in a second direction;
the plurality of second slits comprises a third sub slit extending in a third direction and a fourth subslit extending in a fourth direction; and
the first direction, the second direction, the third direction and the fourth direction are different from each other.

17. The array substrate according to claim 1, wherein an area of the first subpixel electrode is different from that of the second subpixel electrode.

18. A display device, comprising the array substrate according to claim 1.

19. The display device according to claim 18, further comprising:
a color filter substrate that comprises a common electrode with a plurality of third slits extending in at least two directions, wherein the pixel electrode comprises a platelike electrode block, and a region where the plurality of third slits is located corresponds to a region where the platelike electrode block is located.

* * * * *